(12) United States Patent
Pradhan

(10) Patent No.: US 8,816,770 B2
(45) Date of Patent: Aug. 26, 2014

(54) LOW-VOLTAGE CONSTANT-GM RAIL-TO-RAIL CMOS INPUT STAGE WITH IMPROVED GAIN

(75) Inventor: Kishan Pradhan, Bangalore (IN)

(73) Assignee: LSI Corporation, San Jose, CA (US)

( * ) Notice: Subject to any disclaimer, the term of this patent is extended or adjusted under 35 U.S.C. 154(b) by 26 days.

(21) Appl. No.: 13/595,102

(22) Filed: Aug. 27, 2012

(65) Prior Publication Data

US 2014/0055200 A1 Feb. 27, 2014

(51) Int. Cl.
*H03F 3/45* (2006.01)
(52) U.S. Cl.
CPC .................................. *H03F 3/45* (2013.01)
USPC .......................................... 330/253; 330/258
(58) Field of Classification Search
CPC ............................... H03F 3/45479; H03F 3/45
USPC .......................................... 330/235, 253–261
See application file for complete search history.

(56) References Cited

U.S. PATENT DOCUMENTS

| | | | |
|---|---|---|---|
| 6,535,030 B1 * | 3/2003 | Nix ................................. | 327/65 |
| 7,336,123 B2 | 2/2008 | Yoshida et al. .................... | 330/9 |
| 7,432,762 B2 | 10/2008 | Bhattacharya et al. ........ | 330/253 |
| 7,642,853 B2 | 1/2010 | Dabag et al. .................... | 330/267 |
| 8,143,948 B2 | 3/2012 | Moraveji ........................ | 330/255 |
| 8,212,757 B2 | 7/2012 | Huang ............................. | 345/98 |
| 2010/0225393 A1 | 9/2010 | Moraveji ........................ | 330/252 |
| 2011/0298541 A1 | 12/2011 | Shi ................................. | 330/261 |

OTHER PUBLICATIONS

Carillo, J.M., et al., "Constant-gm Constant-Slew_Rate High-Bandwidth Low-Voltage Rail-To-Rail CMOS Input Stage for VLSI Cell Libraries", IEEE Journal of Solid-State Circuits, vol. 8, No. 8, 2003, pp. I-165 to I-168.

* cited by examiner

*Primary Examiner* — Robert Pascal
*Assistant Examiner* — Khiem Nguyen
(74) *Attorney, Agent, or Firm* — Christopher P. Maiorana, PC

(57) ABSTRACT

The present invention concerns an apparatus comprising a first circuit and a second circuit. The first circuit may be configured to generate an output signal in response to a differential input signal, a first power supply and a ground. The output signal may have a rail-to-rail voltage with a magnitude between the first power supply and the ground. The first circuit may also be configured to source an intermediate differential signal in response to the differential input signal, the first power supply and ground. The second circuit may be configured to sink the differential intermediate signal in response to the differential input signal, the first power supply, ground and a second power supply. The second circuit may flatten the transconductance of the first circuit relative to a common mode voltage of the differential input signal.

13 Claims, 5 Drawing Sheets

US 8,816,770 B2

LOW-VOLTAGE CONSTANT-GM RAIL-TO-RAIL CMOS INPUT STAGE WITH IMPROVED GAIN

FIELD OF THE INVENTION

The present invention relates to amplifier circuits generally and, more particularly, to a method and/or apparatus for implementing a low-voltage constant-gm rail-to-rail CMOS input stage with improved gain.

BACKGROUND OF THE INVENTION

Conventional amplifier circuits often implement operational amplifiers. Supply voltages tend to decrease as process technology scales down. In low voltage applications, signal levels remain the same to obtain a targeted signal-to-noise ratio. Conventional input differential transistor pairs cannot satisfy stringent signal-to-noise specifications. Conventional approaches suffer from drawbacks such as low DC gain when input common mode is close to ground.

It would be desirable to implement a low-voltage constant-gm rail-to-rail CMOS stage with improved gain. It would also be desirable to implement a low voltage constant-gm rail-to-rail CMOS input stage that may be used in analog and/or mixed signal applications.

SUMMARY OF THE INVENTION

The present invention concerns an apparatus comprising a first circuit and a second circuit. The first circuit may be configured to generate an output signal in response to a differential input signal, a first power supply and a ground. The output signal may have a rail-to-rail voltage with a magnitude between the first power supply and the ground. The first circuit may also be configured to source an intermediate differential signal in response to the differential input signal, the first power supply and ground. The second circuit may be configured to sink the differential intermediate signal in response to the differential input signal, the first power supply, ground and a second power supply. The second circuit may flatten the transconductance of the first circuit relative to a common mode voltage of the differential input signal.

The objects, features and advantages of the present invention include providing an amplifier stage that may (i) provide an improvement in gain, (ii) reduce variations in gain, (iii) reduce harmonic distortion with higher gain, (iv) be implemented without additional design specifications and/or extra gain stages, (v) provide a low-voltage constant-gm rail-to-rail CMOS input stage with improved gain, and/or (vi) overcome DC gain issues.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
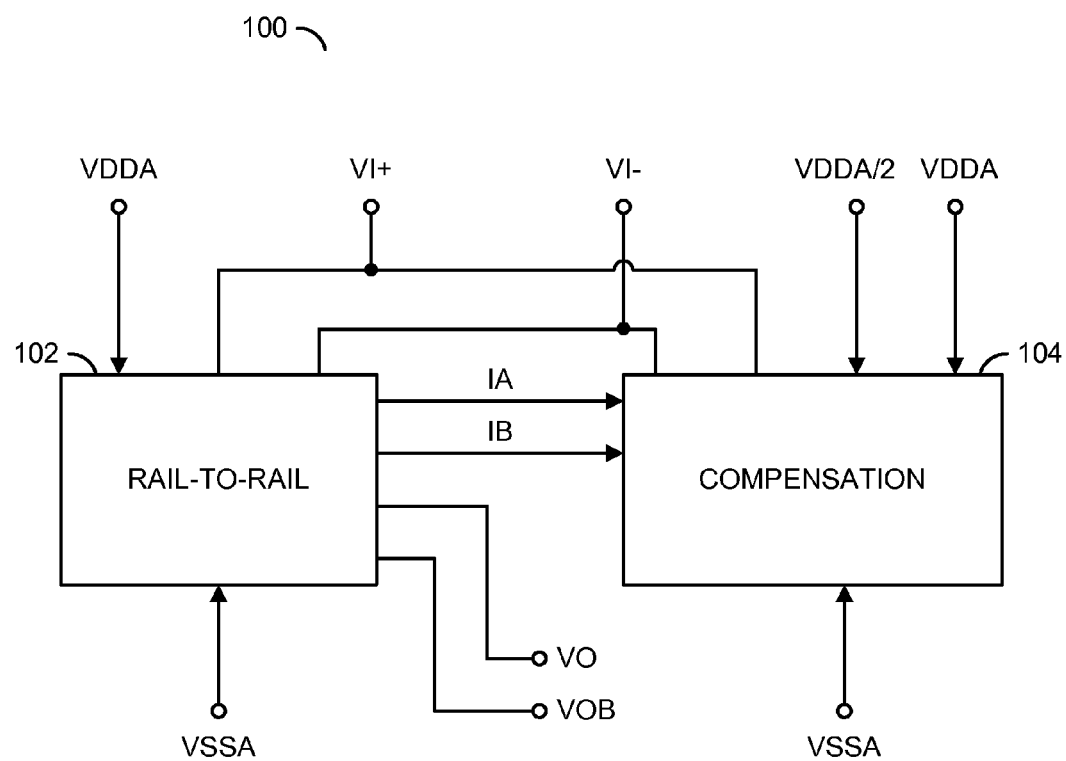
FIG. 1 is a block diagram of the present invention.

Referring to FIG. 1, a block diagram of a circuit 100 is shown in accordance with an embodiment of the present invention. The circuit 100 generally comprises a block (or circuit) 102 and a block (or circuit) 104. The circuit 102 may provide a low voltage constant-gm rail-to-rail CMOS input stage that may be used in analog and/or mixed signal applications. The circuit 104 may be implemented as a compensation circuit. The circuit 100 may improve the gain of an input stage across a rail-to rail input common mode. The circuit 100 may also provide a higher gain and/or may improve harmonic distortion of an operational-amplifier. The circuit 100 may incorporate a general purpose low-voltage constant-gm rail-to-rail input stage 102 that may provide a solution to improve the gain across rail-to-rail input common mode. The circuit 100 may provide a gain enhancement.

The circuit 102 may receive a signal (e.g., VDDA), a signal (e.g., VI+), a signal (e.g., VI−), and a signal (e.g., VSSA). The circuit 102 may present a current (e.g., IA), a current (e.g., IB), a signal (e.g., V0), and a signal (e.g., V0B). The circuit 104 may receive the signal VDDA, a signal (e.g., VDDA/2), the signal VI+, the signal VI−, the current LA, the current IB and the signal VSSA. The signal VDDA may be a supply voltage. The signal VDDA/2 may have a magnitude around one half of the supply voltage VDDA. The signal VSSA may be ground voltage.

Figure 2:
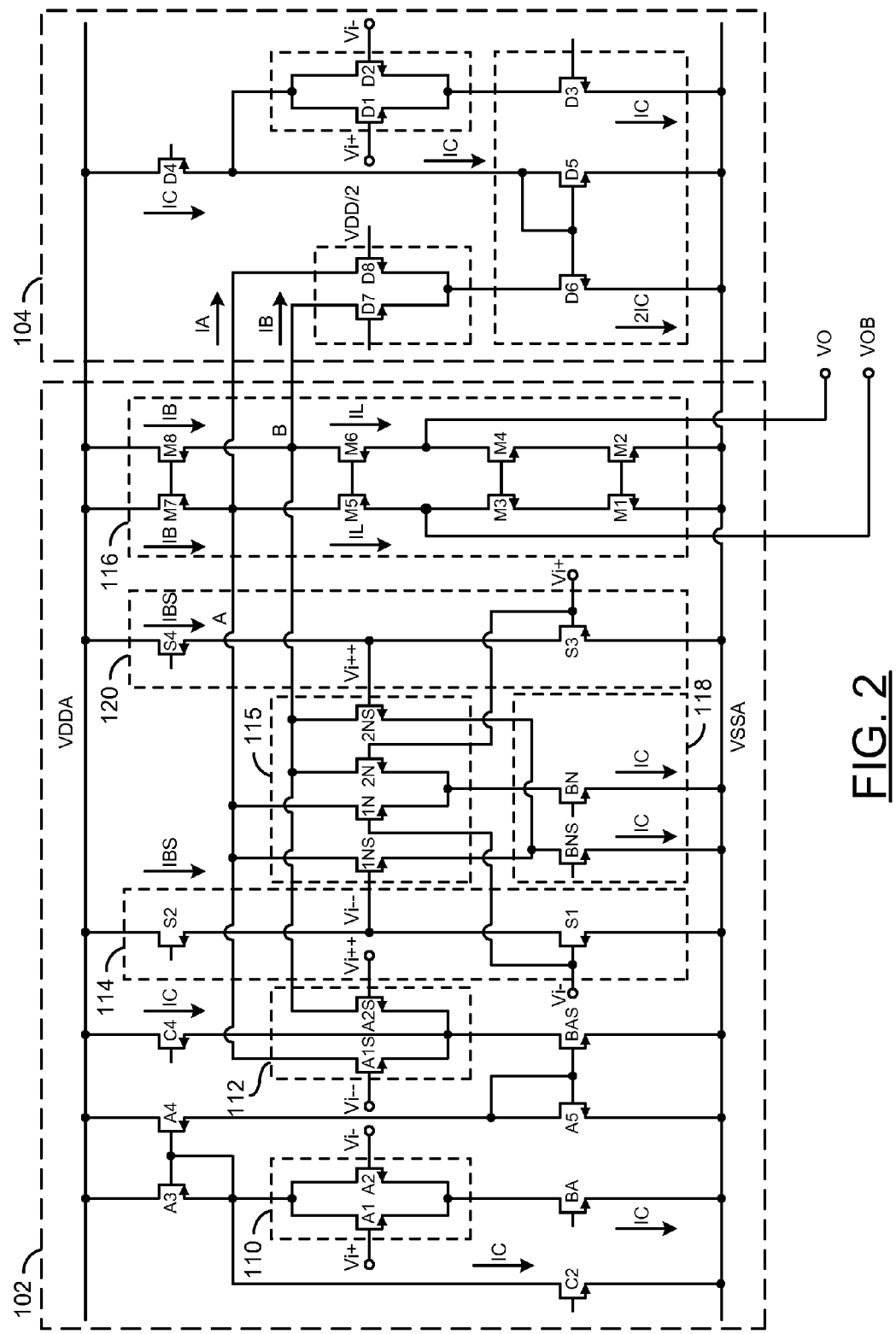
FIG. 2 is a more detailed diagram of the present invention.

Referring to FIG. 2, a more detailed diagram of the circuit 100 is shown. The circuit 100 may overcome limitations on the input common mode voltage VCMR that may commonly be associated with a typical n-channel or p-channel differential input stage. The signal VI (e.g., either VI+ or VI−) may be presented to the input terminal of each amplifier stage. The signal VI may have a voltage range when a particular amplifier becomes operation. The voltage range of the signal VI may be referred to as a voltage common mode range (VCMR). The signals VI+/VI− may represent a positive/negative terminal of each amplifier stage. Two floating voltage sources (e.g., VI++/VI−−) may be implemented by two similar source followers (e.g., S1-S2 and/or S3-S4) connected in front of the input terminals of one of the differential pairs (1NS-2NS). The source followers S1-S2 and/or S3-S4 may provide a positive voltage shift on the signal VGS to the signal VCMR applied to the differential pair 1NS-2NS. To ensure rail-to-rail operation, the voltage shift from the signal VCMR should normally keep the corresponding input pair active when the other differential pair (e.g., 1N-2N) is inactive (e.g., when the signal VCMR is close to ground).

The circuit 102 generally comprises a section 110, a section 112, a section 114, a section 115, a section 116, a section 118, and a section 120. The section 112 may include a transistor A1S and a transistor A2S. The section 112 may be active when a common mode is at a mid level. The section 114 may include a transistor S1 and a transistor S2. The section 115 may include a transistor 1N and a transistor 2N. The transistor pair 1N and 2N may be active when an input mode is close to a level of the signal VDDA. The section 115 may also include the transistor 1NS and the transistor 2NS. The transistor 1NS and 2NS may be active when a common mode is close to a level of the signal SSA. The section 120 may include a transistor S3 and a transistor S4.

The transistor S1 and a transistor S2 may be implemented as PMOS transistors. Similarly, the transistor S3 and the transistor S4 may be implemented as PMOS transistors. The transistor pair S1 and S2 and the transistor pair S3 and S4 may be implemented as level shifters configured to shift an input level when the circuit 100 is active.

For levels of the signal VCMR close to ground, the current source transistors (e.g., BA and BN) and hence, the transistor pairs A1-A2 and 1N-2N, are normally cut-off. Then, the small- and large-signal behaviors of the rail-to-rail input stage result only by the contribution of the differential pair 1NS-2NS, which is biased with current equal to the current IC (the ensuing transconductance will be referred to as $g_{m0}$). In the middle voltage range, both input pairs (1N-2N and 1NS-2NS) are active. However, a bias current equal to the current IC is provided to an input pair A1S-A2S, which cancels out the limiting current and transconductance contribution of one of the differential pairs of the input stage. Finally, for values of the signal VCMR close to the supply VDDA, the bias current IBS of the input level shifters becomes zero and, consequently, the input pairs A1S-A2S and 1NS-2NS provide no contribution to the output. Thus, the only differential pair active is 1N-2N, and the small and large signal behaviors of the stage are the same as in the above considered operating regions. The following TABLE 1 shows the current flowing in each of the differential pairs and through the load devices M5/M6 when the circuit 104 is not present:

TABLE 1

| | Current conducting Diff Pairs | | | Current through |
|---|---|---|---|---|
| VCMR Range | 1N-2N | 1NS-2NS | A1S-A2S | M5/M6($I_L$) |
| Close to Ground (VSSA) | 0 | $I_C/2$ | 0 | $I_B$-$I_C/2$ |
| Mid-level | $I_C/2$ | $I_C/2$ | $I_C/2$ | $I_B$-3$I_C/2$ |
| Close to Supply (VDDA) | $I_C/2$ | $I_C/2$ | $I_C/2$ | $I_B$-3$I_C/2$ |

Open loop gain of the amplifier in FIG. 2, $Av \approx g_{m0}[g_{m4}r_{o4}r_{o2} \| g_{m6}r_{o6}r_{o8}]$ Where, $g_{mx}$ and $r_{0x}$ are the transconductance and output impedance of transistor MX in FIG. 2 respectively.

For simplicity assume, $g_{m4} \approx g_{m6}$ $r_{o4} \approx r_{o6}$ $r_{o2} \approx r_{o8}$ Therefore, $Av \approx g_{m0}[g_{m4}r_{o4}r_{o2}]/2$ Across rail-to-rail $g_{m0}$ is nearly constant, therefore, $Av \alpha g_{m0}[g_{m4}r_{o4}r_{o2}]/2$ $g_{m4} \alpha \sqrt{I_L}$ $r_{o4}, r_{o2} \alpha 1/I_L$ Therefore, $Av \alpha \sqrt{I_L} \times 1/I_L \times 1/I_L$ $Av \alpha I_L^{-3/2}$ $\Delta Av \alpha (\Delta I_L)^{-3/2}$ [when $g_{m0}$ is constant]

Therefore, when transconductance of the input stage 102 is constant, the current through the transistors M5/M6 should also remain constant across rail-to-rail in order to have a constant gain Av.

When the signal VCMR is close to the ground voltage VSSA, the transistors D1/D2 are cut-off and no current flows through the transistor D3. All of the current IC flows through the transistor D5 and the current IC flows through each node A/B. This compensates for the cut-off of the transistors 1N/2N and the transistors A1S/A2S. As a result, the current IL is maintained as $I_L = I_B - 3I_C/2$ when the signal VCMR is close to ground.

When the signal VCMR is in the middle voltage or close to VDDA range then D1/D2 are active and $I_C$ flows through D3 and no current flows D5/D6/D7/D8. As a result no current flows through A/B and, consequently, $I_L = I_B - 3I_C/2$ is maintained at this input common mode range. The following TABLE 2 shows the current flowing in each differential pair and through the load devices M5/M6.

TABLE 2

| | Current conducting Diff Pairs | | | Current through |
|---|---|---|---|---|
| VCMR Range | 1N-2N | 1NS-2NS | A1S-A2S | M5/M6($I_L$) |
| Close to Ground (VSSA) | $I_C/2$ | $I_C/2$ | $I_C/2$ | $I_B$-3$I_C/2$ |
| Mid-level | $I_C/2$ | $I_C/2$ | $I_C/2$ | $I_B$-3$I_C/2$ |
| Close to Supply (VDDA) | $I_C/2$ | $I_C/2$ | $I_C/2$ | $I_B$-3$I_C/2$ |

Figure 3:
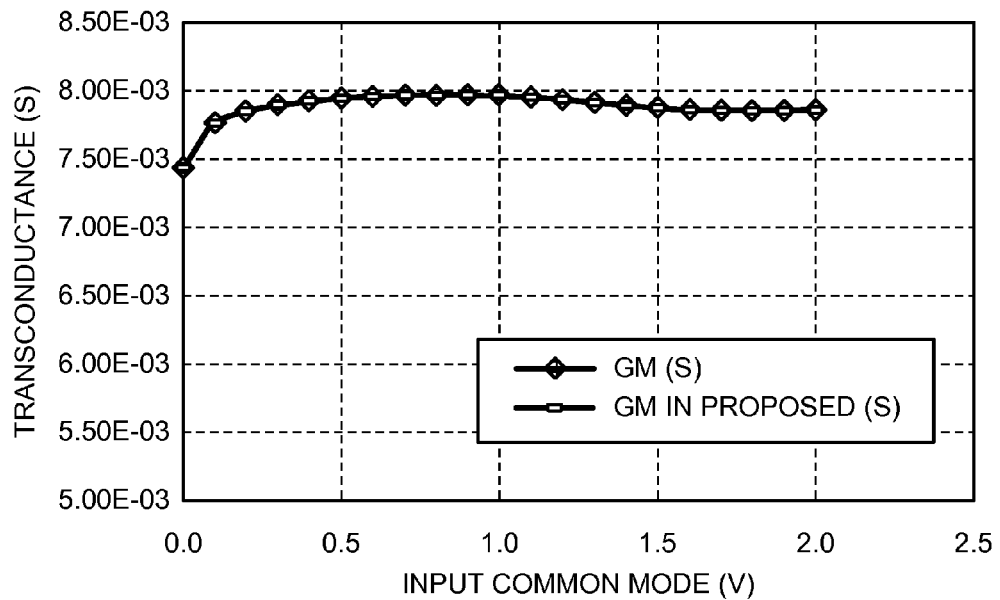
FIG. 3 is a plot of the comparison of transconductance versus input common mode voltage.

Referring to FIG. 3, a plot illustrating a comparison of the gm with respect to the signal VCMR in the case of the circuit 100 versus a conventional circuit is shown. FIG. 3 shows the variation of transconductance GM with respect to the signal VCMR as being nearly the same.

Figure 4:
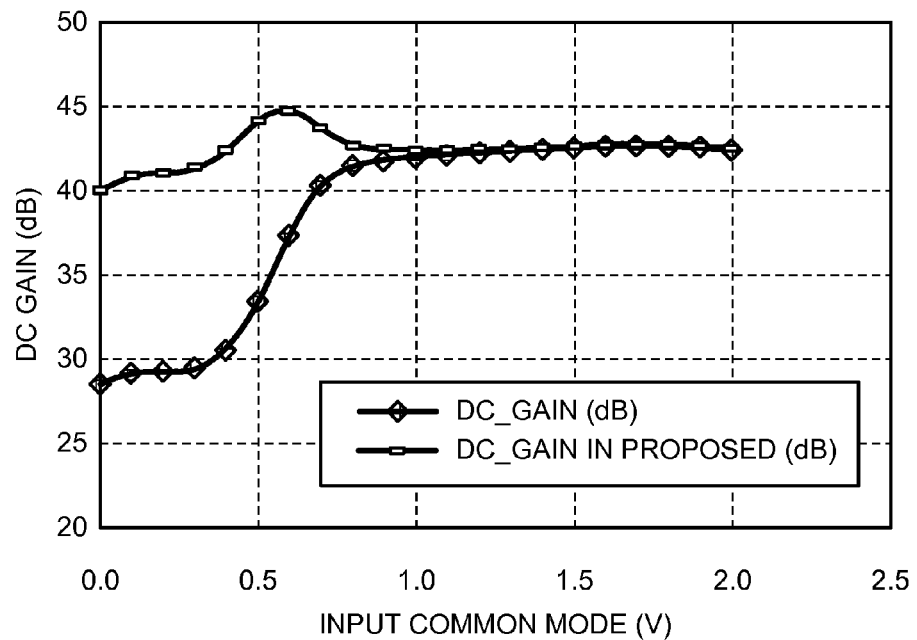
FIG. 4 is a plot of a comparison of gain variation versus input common mode.

Referring to FIG. 4, a plot illustrating a comparison of DC gain with respect to the signal VCMR of the circuit 100 versus a conventional circuit. An example of minimum gain shown is 40 dB. The variation of gain of 40-45 dB illustrates an improvement from the gain of 28-43 dB without the circuit 104.

Figure 5:
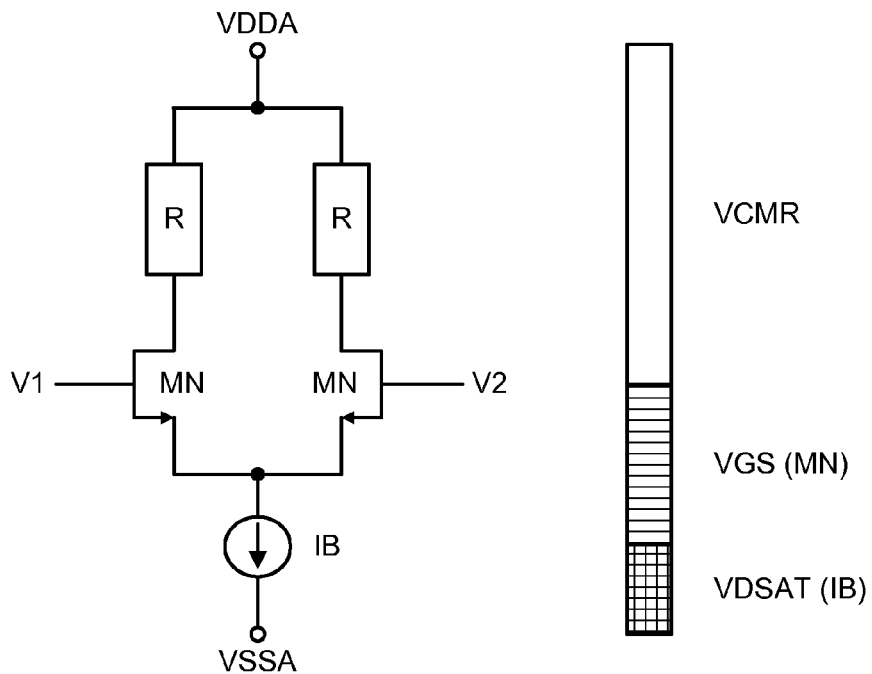
FIG. 5 is a conceptual diagram of an N-type differential input stage.

Referring to FIG. 5, a diagram illustrating an example of an N-type differential input stage used in the circuit 100 is shown. A voltage VCMR may be equal to VDDA−Vgs(MN)−Vdsat(IB).

Figure 6:
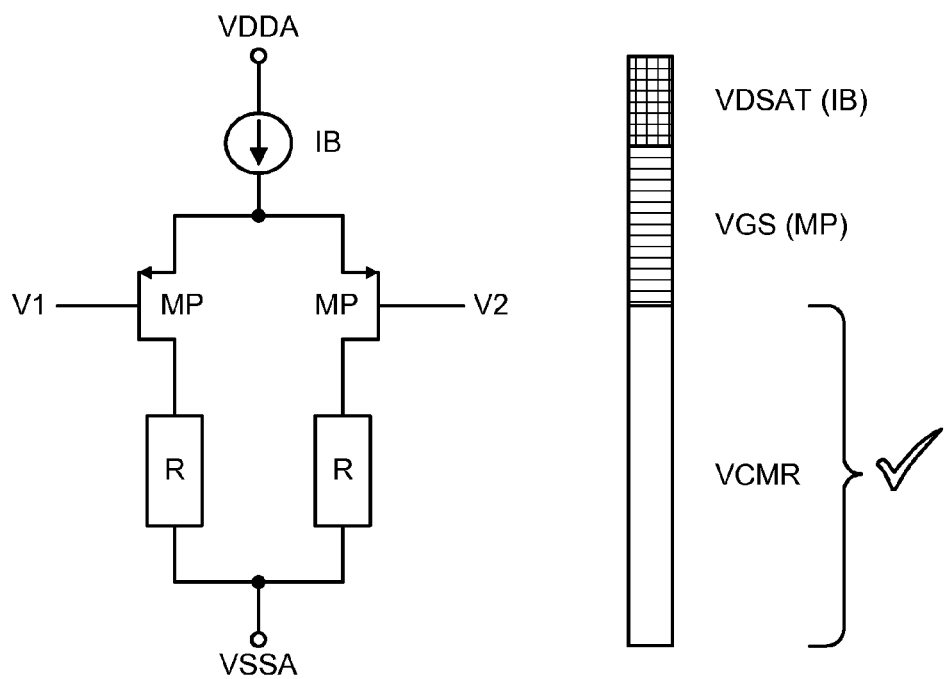
FIG. 6 is a conceptual diagram of a P-type differential input stage.

Referring to FIG. 6, a P-type differential input stage is shown. The circuit of FIG. 6 illustrates the voltage VCMR as being equal to VDDA−Vgs(MP)−VDSAT(IB).

Figure 7:
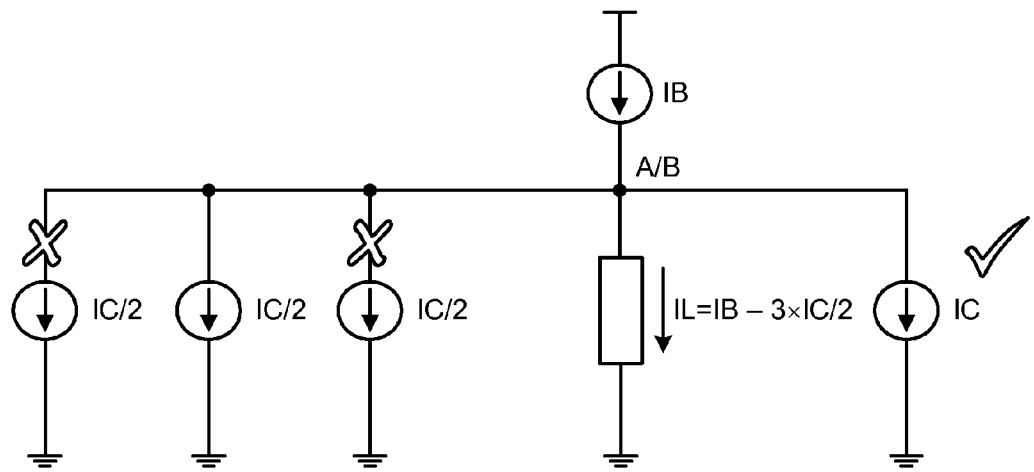
FIG. 7 is a conceptual diagram of the current flow when an input voltage level is close to ground.

Referring to FIG. 7, a conceptual diagram of the circuit 100 is shown when an input voltage is close to ground. In general, a current I1 may be equal to a current Ib−3×Ic/2.

Figure 8:
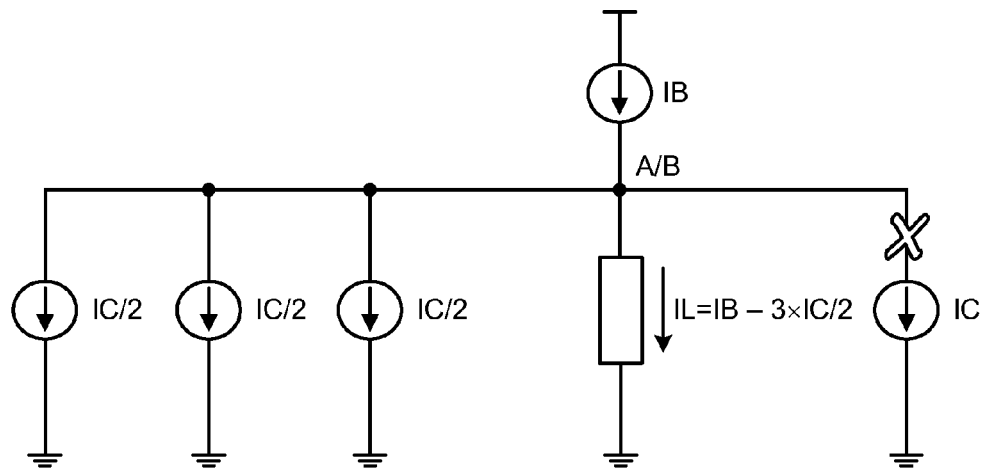
FIG. 8 is a conceptual diagram when an input voltage level is close to mid level and/or close to a supply level.

Referring to FIG. 8, a diagram of the circuit 100 is shown when an input voltage is close to mid level or close to a supply voltage. In a current IL may be equal to a current Ib−3×Ic/2. In this case, the circuit 104 may be reduced to limit the current IC added to the overall current.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to the preferred embodiments thereof, it will be understood by those skilled in the art that various changes in form and details may be made without departing from the scope of the invention.

The invention claimed is:

1. An apparatus comprising:
   a first circuit configured to (i) generate an output signal in response to a differential input signal, a first power supply and a ground, wherein said output signal has a rail-to-rail voltage with a magnitude between said first power supply and said ground, and (ii) source an intermediate differential signal in response to said differential input signal, said first power supply and said ground; and
   a second circuit configured to sink said differential intermediate signal in response to said differential input signal, said first power supply, said ground and a second power supply, wherein said second circuit flattens a transconductance of said first circuit relative to a common mode voltage of said differential input signal by shifting said differential input signal when said common mode voltage is close to said ground.

2. The apparatus according to claim 1, wherein said second circuit operates when said input signal is close to ground.

3. The apparatus according to claim 1, wherein said first circuit is further configured to source said intermediate differential in response to said transconductance of said first circuit.

4. The apparatus according to claim 1, wherein said magnitude of said rail-to-rail voltage extends up to said first power supply and down to said ground over a plurality of voltage conditions on said first power supply and said second power supply.

5. The apparatus according to claim 1, wherein said apparatus is implemented as an input stage.

6. The apparatus according to claim 1, wherein said output signal has a relatively constant transconductance.

7. The apparatus according to claim 1, wherein said apparatus is compatible with mixed signal applications.

8. The apparatus according to claim 1, wherein said apparatus is compatible with analog applications.

9. The apparatus according to claim 1, wherein said apparatus is implemented as one or more integrated circuits.

10. An apparatus comprising:
    means for generating an output signal in response to a differential input signal, a first power supply and a ground, wherein (i) said output signal has a rail-to-rail voltage with a magnitude between said first power supply and said ground, and (ii) source an intermediate differential signal in response to said differential input signal, said first power supply and said ground; and
    means for sinking said differential intermediate signal in response to said differential input signal, said first power supply, said ground and a second power supply, wherein said means for sinking said differential intermediate signal flattens a transconductance of said apparatus relative to a common mode voltage of said differential input signal by shifting said differential input signal when said common mode voltage is close to said ground.

11. A method for providing a constant transconductance input stage, comprising the steps of:
    (A) generating an output signal in response to a differential input signal, a first power supply and a ground, wherein (i) said output signal has a rail-to-rail voltage with a magnitude between said first power supply and said ground, and (ii) source an intermediate differential signal in response to said differential input signal, said first power supply and said ground; and
    (B) sinking said differential intermediate signal in response to said differential input signal, said first power supply, said ground and a second power supply, wherein said method flattens a transconductance of said output signal relative to a common mode voltage of said differential input signal by shifting said differential input signal when said common mode voltage is close to said around.

12. The apparatus according to claim 1, wherein said second circuit further comprises:
    a first transistor pair configured to be active when said common mode voltage is at a mid-level.

13. The apparatus according to claim 12, wherein said second circuit further comprises:
    a second transistor pair configured to be active when said common mode voltage is close to said ground.

* * * * *